(12) United States Patent
Kim et al.

(10) Patent No.: US 11,894,333 B2
(45) Date of Patent: Feb. 6, 2024

(54) SEMICONDUCTOR PACKAGE

(71) Applicant: Samsung Electronics Co., Ltd., Suwon-si (KR)

(72) Inventors: Dahee Kim, Cheonan-si (KR); Jeongrim Seo, Asan-si (KR); Gookmi Song, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 244 days.

(21) Appl. No.: 17/401,664

(22) Filed: Aug. 13, 2021

(65) Prior Publication Data
US 2022/0165698 A1 May 26, 2022

(30) Foreign Application Priority Data
Nov. 24, 2020 (KR) .......... 10-2020-0159233

(51) Int. Cl.
H01L 23/31 (2006.01)
H01L 23/00 (2006.01)
(Continued)

(52) U.S. Cl.
CPC .......... H01L 24/20 (2013.01); H01L 21/4853 (2013.01); H01L 21/4857 (2013.01);
(Continued)

(58) Field of Classification Search
CPC ......... H01L 24/20; H01L 24/13; H01L 24/16; H01L 24/32; H01L 24/48; H01L 24/73; H01L 24/92; H01L 24/06; H01L 24/09; H01L 24/14; H01L 24/17; H01L 24/19; H01L 21/4853; H01L 21/4857; H01L 23/49838; H01L 23/562; H01L 23/49816;
(Continued)

(56) References Cited

U.S. PATENT DOCUMENTS
8,680,685 B2 3/2014 Lim et al.
9,035,471 B2 5/2015 Topacio et al.
(Continued)

FOREIGN PATENT DOCUMENTS
EP 3168872 A2 * 5/2017 .......... H01L 23/3114

Primary Examiner — Kyoung Lee
Assistant Examiner — Christina A Sylvia
(74) Attorney, Agent, or Firm — Muir Patent Law, PLLC

(57) ABSTRACT

A semiconductor package includes: a redistribution substrate including a connection via and a redistribution layer electrically connected to each other, and a redistribution pad electrically connected to the redistribution layer by the connection via, a space pattern separating at least some of the redistribution pads from each other, a dummy metal pattern at least partially surrounded by the space pattern, and a degassing opening passing through at least one of the redistribution pad and the dummy metal pattern; a connection bump electrically connected to the redistribution pad; and a semiconductor chip on the redistribution substrate and including a connection pad electrically connected to the redistribution layer, the redistribution pad including a plurality of protrusions protruding from the same plane in directions different from each other and having a corner having a rounded shape, and the dummy metal pattern includes branch patterns each extending in directions different from one another.

20 Claims, 15 Drawing Sheets

(51) Int. Cl.
*H01L 23/538* (2006.01)
*H01L 21/48* (2006.01)
*H01L 25/10* (2006.01)

(52) U.S. Cl.
CPC ...... *H01L 23/3128* (2013.01); *H01L 23/5383* (2013.01); *H01L 23/5386* (2013.01); *H01L 23/5389* (2013.01); *H01L 24/19* (2013.01); *H01L 25/105* (2013.01); *H01L 2224/214* (2013.01); *H01L 2224/2105* (2013.01); *H01L 2225/1035* (2013.01); *H01L 2225/1041* (2013.01); *H01L 2225/1058* (2013.01); *H01L 2924/3512* (2013.01)

(58) Field of Classification Search
CPC ........... H01L 23/49822; H01L 23/3128; H01L 23/5383; H01L 23/5386; H01L 23/5389; H01L 23/49811; H01L 23/528; H01L 23/485; H01L 23/525; H01L 25/105; H01L 2225/1035; H01L 2225/1041; H01L 2225/1058; H01L 2924/3512; H01L 2924/15174; H01L 2924/15311; H01L 2924/181; H01L 2224/2105; H01L 2224/214; H01L 2224/0401; H01L 2224/04105; H01L 2224/05624; H01L 2224/131; H01L 2224/13147; H01L 2224/16227; H01L 2224/16237; H01L 2224/18; H01L 2224/215; H01L 2224/2919; H01L 2224/32225; H01L 2224/45099; H01L 2224/48227; H01L 2224/73204; H01L 2224/12105; H01L 2224/81411; H01L 2224/81416; H01L 2224/81424; H01L 2224/81439; H01L 2224/81444; H01L 2224/81447; H01L 2224/81455; H01L 2224/81466; H01L 2224/8349; H01L 2224/8359; H01L 2224/83688; H01L 2224/92125
See application file for complete search history.

(56) References Cited

U.S. PATENT DOCUMENTS

| | | | |
|---|---|---|---|
| 9,859,187 B2* | 1/2018 | Chuang | ............... H01L 23/3675 |
| 9,929,112 B2 | 3/2018 | Hsieh et al. | |
| 10,115,648 B2 | 10/2018 | Seo et al. | |
| 2017/0141041 A1 | 5/2017 | Lin et al. | |
| 2017/0338175 A1* | 11/2017 | Liu | ................... H01L 23/49827 |
| 2020/0098707 A1 | 3/2020 | Chen et al. | |
| 2023/0131240 A1* | 4/2023 | Ko | ...................... H01L 23/5386 |
| | | | 257/690 |

* cited by examiner

US 11,894,333 B2

SEMICONDUCTOR PACKAGE

CROSS-REFERENCE TO RELATED APPLICATION(S)

This application claims the benefit of priority under 35 U.S.C. § 119 of Korean Patent Application No. 10-2020-0159233, filed on Nov. 24, 2020, in the Korean Intellectual Property Office, the entire contents of which are incorporated herein by reference for all purposes.

BACKGROUND

1. Field

The present inventive concept relates to a semiconductor package.

2. Description of Related Art

A semiconductor package may be mounted on a substrate (e.g., main board) through a connection bump such as a solder ball. Reliability of the semiconductor package may depend on a state in which the connection bump and the semiconductor package are connected to each other. In order to improve the reliability of the semiconductor package, there is a need for a technology capable of preventing a crack from occurring in an insulating material layer around the connection bump.

SUMMARY

Example embodiments provide a semiconductor package having improved reliability.

According to example embodiments, a semiconductor package includes: a redistribution substrate including a connection via and a redistribution layer electrically connected to each other, and a redistribution pad electrically connected to the redistribution layer by the connection via; and a semiconductor chip disposed on the redistribution substrate and including a connection pad electrically connected to the redistribution layer, wherein the redistribution pad has a shape having a plurality of protrusions protruding in directions different to each other in a plan view, and the redistribution substrate further includes a dummy metal pattern disposed between adjacent redistribution pads.

According to example embodiments, a semiconductor package includes: a semiconductor chip including a connection pad; and a redistribution substrate including a redistribution pad electrically connected to the connection pad, a space pattern separating at least some of the redistribution pads from each other, a dummy metal pattern disposed on the same level as the redistribution pad and at least partially surrounded by the space pattern, a redistribution layer disposed on a different level from the redistribution pad, and a connection via connecting the redistribution pad and the redistribution layer to each other, wherein an external surface of the redistribution pad has a concave-convex shape.

According to example embodiments, a semiconductor package includes: a redistribution substrate including a connection via and a redistribution layer electrically connected to each other, and a redistribution pad electrically connected to the redistribution layer by the connection via, a space pattern separating at least some of the redistribution pads from each other, a dummy metal pattern at least partially surrounded by the space pattern, and a degassing opening passing through at least one of the redistribution pad and the dummy metal pattern; a connection bump electrically connected to the redistribution pad; and a semiconductor chip disposed on the redistribution substrate and including a connection pad electrically connected to the redistribution layer, wherein the redistribution pad includes a plurality of protrusions protruding from the same plane in directions different to each other, based on a center thereof and having a corner having a rounded shape, and the dummy metal pattern includes branch patterns each extending in four directions different from one another.

BRIEF DESCRIPTION OF DRAWINGS

The above and other aspects, features, and advantages of the present inventive concept will be more clearly understood from the following detailed description, taken in conjunction with the accompanying drawings, in which like numerals refer to like elements throughout. In the drawings.

DETAILED DESCRIPTION

Figure 1:
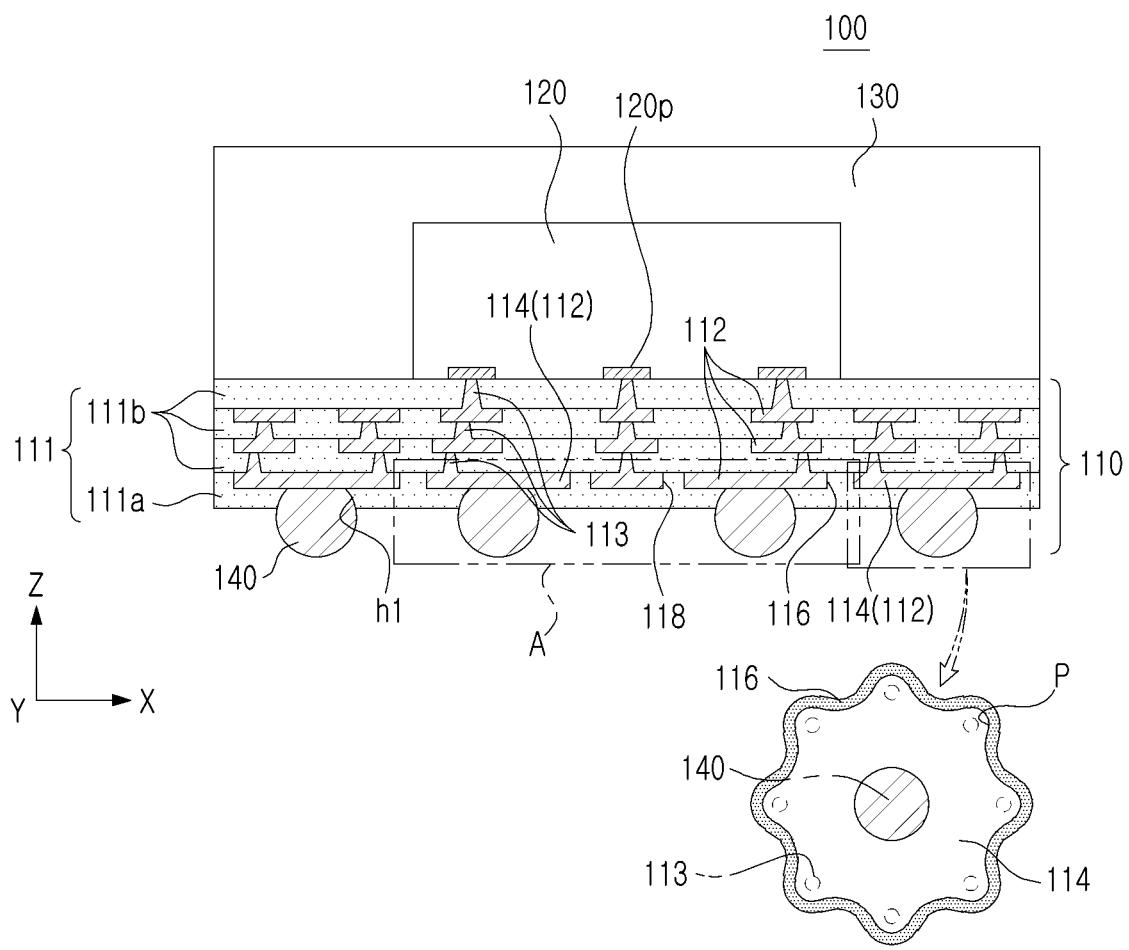
FIG. 1 is a cross-sectional view of a semiconductor package, according to an example embodiment.

Hereinafter, example embodiments will be described with reference to the accompanying drawings:

FIG. 1 is a cross-sectional view of a semiconductor package, according to an example embodiment.

Figure 2A:
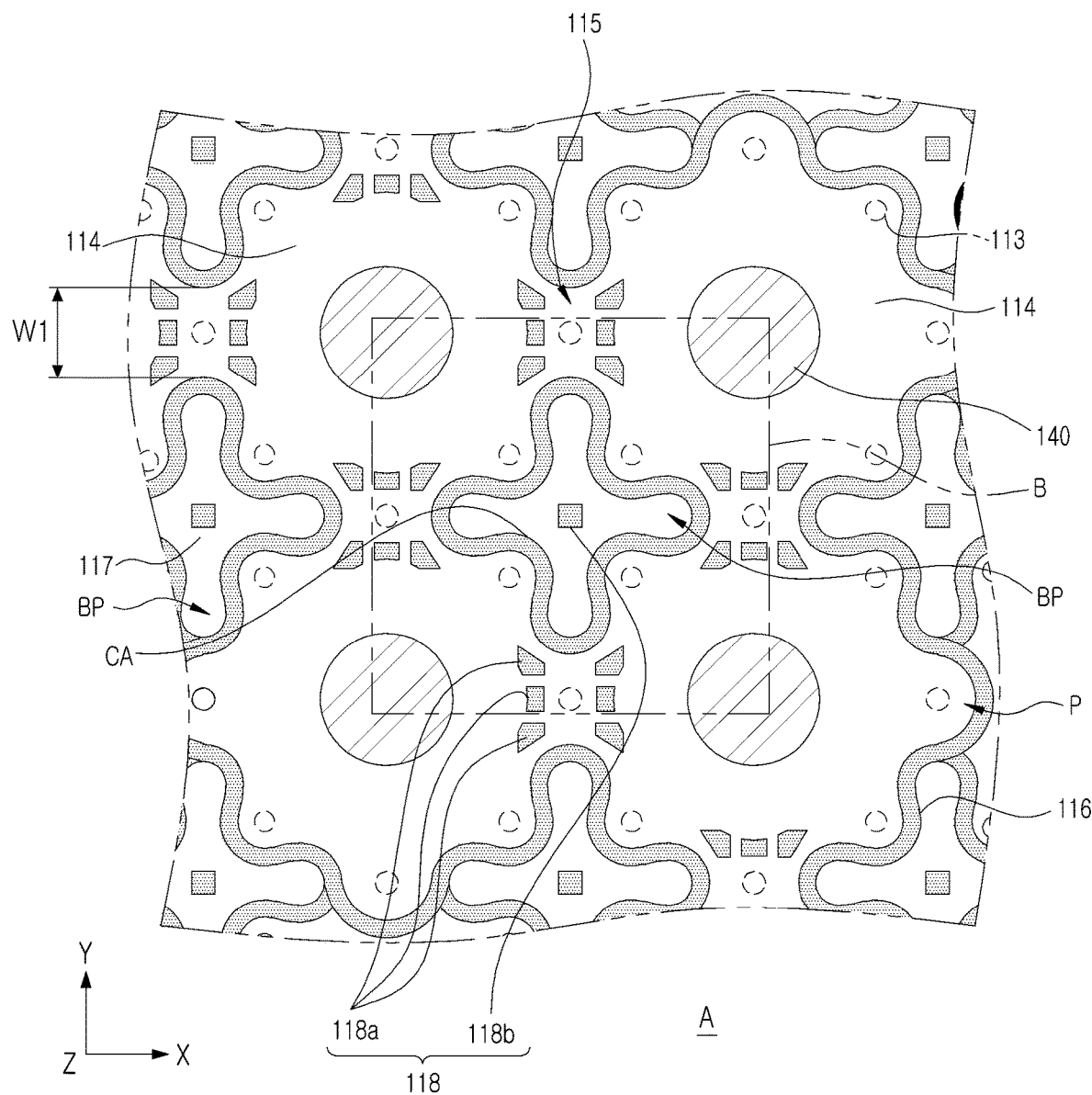
FIG. 2A is a partially enlarged plan view of a region A including a redistribution pad of the semiconductor package of FIG. 1, according to an example embodiment.

FIG. 2A is a partially enlarged plan view of the semiconductor package, according to an example embodiment. Specifically, FIG. 2A is an enlarged plan view of a region A including a redistribution pad of FIG. 1.

Figure 2B:
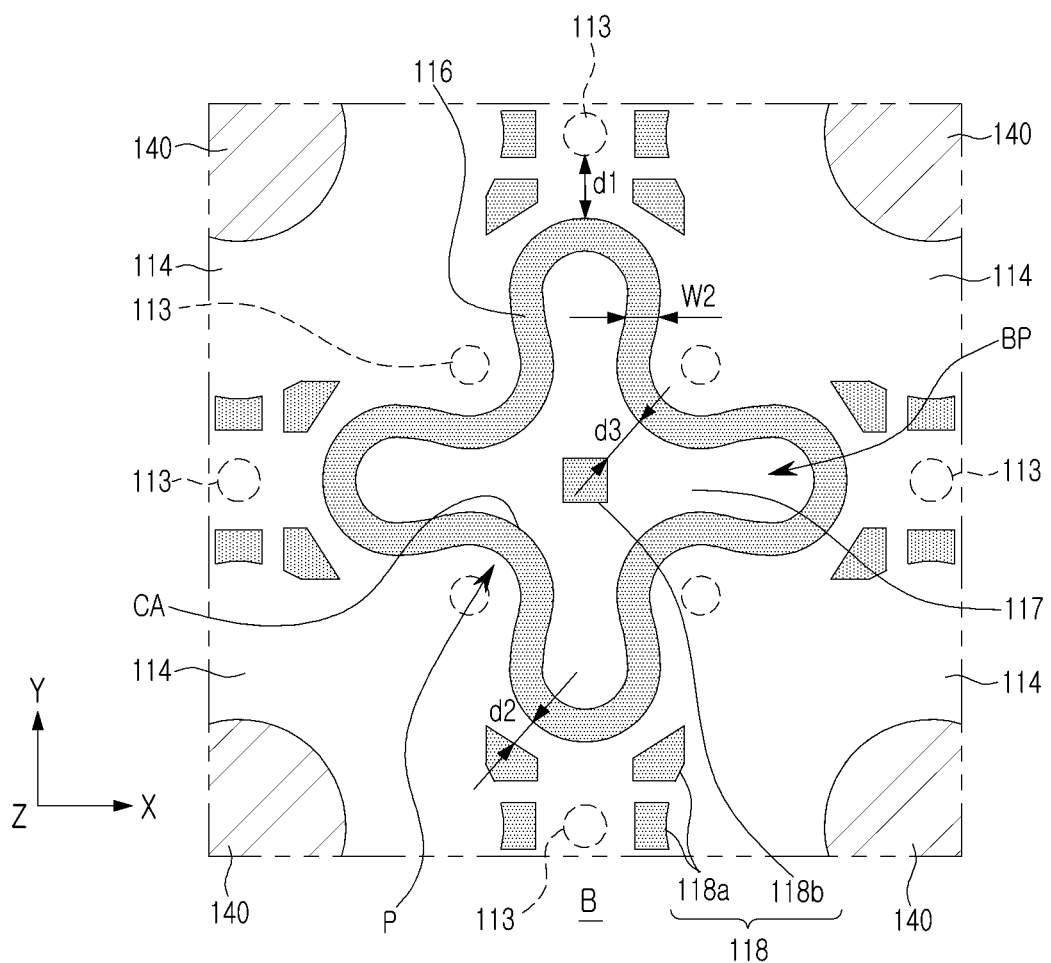
FIG. 2B is a partially enlarged plan view of a region B including a dummy metal pattern of the semiconductor package of FIG. 2A, according to an example embodiment.

FIG. 2B is a partially enlarged plan view of the semiconductor package, according to an example embodiment. Specifically, FIG. 2B is an enlarged plan view of a region B including a dummy metal pattern of FIG. 2A.

Referring to FIGS. 1 to 2B, a semiconductor package 100 may include a redistribution substrate 110, a semiconductor chip 120, an encapsulant 130, and a connection bump 140.

The redistribution substrate 110 is a support substrate on which the semiconductor chip 120 is mounted, and may include an insulating layer 111, a redistribution layer 112, a connection via 113, a redistribution pad 114, a bridge pattern 115, a space pattern 116, a dummy metal pattern 117, and a degassing opening 118.

The insulating layer 111 may include a plurality of insulating layers 111 stacked on each other in a vertical direction (Z direction). For example, the insulating layer 111 may include a first insulating layer 111a and at least one second insulating layer 111b stacked on the first insulating layer 111a. The insulating layer 111 may include an insulating resin. The insulating resin may include a thermosetting resin such as an epoxy resin, a thermoplastic resin such as a polyimide resin, or a resin in which the thermosetting resin or the thermoplastic resin is impregnated with an inorganic filler or/and a glass fiber (or a glass cloth or a glass fabric), for example, prepreg, ajinomoto-build up film (ABF), FR-4 or bismaleimide triazine (BT). The insulating layer 111 may include a photosensitive resin such as a photoimageable dielectric (PID) resin. In this case, the insulating layer 111 may be formed to be thin, and the redistribution layer 112 and the connection via 113 may be formed to be fine. For example, both the first insulating layer 111a and the second insulating layer 111b may include the photosensitive resin. Based on a process, a boundary between the insulating layers 111 disposed on different levels may be unclear. The first insulating layer 111a may have an opening h1 exposing at least a portion of the redistribution pad 114.

The redistribution layer 112 may include the plurality of redistribution layers 112 disposed at different levels on or in the insulating layer 111. For example, the plurality of redistribution layers 112 may be disposed on or in the first insulating layer 111a and disposed on or in at least one second insulating layer 111b, and may be electrically connected to each other. The redistribution layers 112 may redistribute a connection pad 120p of the semiconductor chip 120. The redistribution layers 112 may include a metal material such as copper (Cu), aluminum (Al), silver (Ag), tin (Sn), gold (Au), nickel (Ni), lead (Pb), titanium (Ti), or an alloy thereof. The redistribution layers 112 may perform various functions based on a design. For example, the redistribution layers 112 may include a ground (GND) pattern, a power (PWR) pattern, and a signal (S) pattern. The signal (S) pattern may provide a path for transmission of various signals except for those transmitted by the ground (GND) pattern, the power (PWR) pattern and the like, for example, the signal (S) pattern may transmit a data signal.

The connection via 113 may include the plurality of connection vias 113 disposed at different levels on or in the insulating layer 111. For example, the plurality of connection vias 113 may be disposed on or in the first insulating layer 111a and disposed on or in at least one second insulating layer 111b, and may be electrically connected to each other. The connection vias 113 may pass through the insulating layers 111 and connect the plurality of redistribution layers 112 to each other. For example, the connection vias 113 may pass through at least a portion of the first insulating layer 111a and that of at least one second insulating layer 111b to electrically connect the plurality of redistribution layers 112 disposed at the different levels to each other. The connection vias 113 may electrically connect the redistribution layers 112 and the redistribution pads 114 which are disposed at different levels. The connection vias 113 may include a signal via, a ground via, or a power via. The connection vias 113 may include a metal material including copper (Cu), aluminum (Al), silver (Ag), tin (Sn), gold (Au), nickel (Ni), lead (Pb), titanium (Ti) or an alloy thereof. The connection vias 113 may have a shape of a filled via in which a metal material is filled in a via hole or a conformal via in which a metal material is formed along an inner wall of a via hole.

The redistribution pad 114 may include the plurality of redistribution pads 114 disposed in the insulating layer 111. The redistribution pad 114 may be a lowest redistribution layer 112 of the plurality of redistribution layers 112. Each redistribution pad 114 may be electrically connected to the redistribution layer 112 disposed on a different level from the redistribution pad 114 through the connection via 113. At least a portion of a lower surface of the redistribution pad 114 may be externally exposed by the opening h1 of the first insulating layer 111a, and the redistribution pad 114 may be bonded to and electrically connected to the connection bump 140 disposed in the opening h1. The redistribution pad 114 may include a metal material including copper (Cu), aluminum (Al), silver (Ag), tin (Sn), gold (Au), nickel (Ni), lead (Pb), titanium (Ti), or an alloy thereof.

As illustrated in the enlarged view of FIG. 1 and FIG. 2A, an external surface of the redistribution pad 114 may have a concave-convex shape, when viewed in plan view. For example, the redistribution pad 114 may include a plurality of protrusions P protruding from the same plane in directions different to each other based on a center thereof. In example embodiments, the plurality of protrusions P may extend radially from the center of the redistribution pad 114, and the plurality of protrusions P may be equidistant from one another. For example, the plurality of protrusions P may be evenly distributed around the redistribution pad 114. In an example embodiment, some of the plurality of redistribution pads 114 may be disposed completely separated from the adjacent redistribution pads 114, and the other adjacent redistribution pads 114 may be connected to each other by the bridge pattern 115, as illustrated in FIG. 2A.

At least one of the plurality of protrusions P of the redistribution pad 114 may have a shape in which its corner is rounded. For example, a convex portion of the external surface of the redistribution pad 114 may have a rounded shape. In addition, a concave portion of the external surface of the redistribution pad 114 may also have a rounded shape. The plurality of protrusions P may each have the corner having a rounded shape, and it is thus possible to effectively disperse stress applied to the redistribution pad 114 and the first insulating layer 111a compared to a case in which the protrusion has a sharp or angular shape. Therefore, it is possible to improve reliability of the semiconductor package 100 by preventing an occurrence of a crack in the first insulating layer 111a around the connection bump 140.

The redistribution pads 114 may be disposed to be spaced apart from each other at a predetermined distance by having the space pattern 116 therebetween, and at least some of the redistribution pads 114 may thus be disposed to be separated from each other, thereby reducing the stress applied to the first insulating layer 111a. Therefore, it is possible to improve the reliability of the semiconductor package 100 by preventing the occurrence of a crack in the first insulating layer 111a around the connection bump 140. This improvement will be described in more detail with reference to FIGS. 7 and 8 below. In addition, the connection vias 113 may be arranged along the protrusions P of the redistribution pad 114, and it is thus possible to improve a degree of freedom in interlayer or intralayer design of the connection via 113 connected to the redistribution pad 114.

The bridge pattern 115 may include the plurality of bridge patterns 115 disposed between the redistribution pads 114 to connect some of the redistribution pads 114 to each other. For example, the bridge pattern 115 may be a metal pattern of a region in which the protrusions P of the redistribution pads 114 adjacent to each other are connected to each other. The redistribution pads 114 connected to each other by the bridge pattern 115 may be electrically connected to each other. The bridge pattern 115 may include the same material as the redistribution pad 114 and may be formed integrally with the redistribution pad 114. The bridge pattern 115 may include a metal material including copper (Cu), aluminum (Al), silver (Ag), tin (Sn), gold (Au), nickel (Ni), lead (Pb), titanium (Ti) or an alloy thereof.

At least one of the connection vias 113 may be disposed on a central region of the bridge pattern 115 to be connected to the bridge pattern 115. In an example embodiment, a minimum distance d1 between the connection via 113 connected to the bridge pattern 115 and the space pattern 116 may range from about 15 μm to about 20 μm. In another embodiment, the connection via 113 may not be disposed on the central region of the bridge pattern 115.

The bridge pattern 115 may have a width smaller toward the center thereof. For example, the bridge pattern 115 may include a portion having a width smaller as being farther away from the center of the redistribution pad 114. The bridge pattern 115 may include a first portion and a second portion each having a width smaller as being farther away from the center of each of the redistribution pads 114 disposed on both sides of the bridge pattern 115, and the bridge pattern 115 may have a minimum width W1 in a region where the first portion and the second portion meet each other. In an example embodiment, a minimum width W1 of the bridge pattern 115 may be about 50 μm or more. If the minimum width W1 of the bridge pattern 115 is less than the above range, it is difficult to secure an electrical connection path between the redistribution pads 114, a degree of freedom in designing the connection via 113 may be reduced, and/or a plurality of undulation regions may occur in which a surface of the first insulating layer 111a is bent due to an increased size of the space pattern 116. In addition, the bridge pattern 115 may have a minimum width W1 at the center thereof, and it is thus possible to reduce the stress applied to the first insulating layer 111a by securing a size of a segmental region between the adjacent redistribution pads 114. Therefore, it is possible to improve the reliability of the semiconductor package 100 by preventing the occurrence of a crack in the first insulating layer 111a around the connection bump 140.

The space pattern 116 may define a boundary between the protrusion P of the redistribution pad 114 and the dummy metal pattern 117. The space pattern 116 may at least partially surround the redistribution pad 114 and may separate at least some of the adjacent redistribution pads 114 from each other. The space pattern 116 may at least partially surround the dummy metal pattern 117. The space pattern 116 may be disposed on the same level as the redistribution pad 114, and may allow a degassed component to be easily discharged from the insulating layer 111, together with the degassing opening 118. In an example embodiment, a width W2 of the space pattern 116 separating the redistribution pad 114 and the dummy metal pattern 117 from each other may be about 30 μm or more, and may range from about 30 μm to about 50 μm, for example. If the width W2 of the space pattern 116 is less than the above range, it may fail to fully secure a separation distance between the redistribution pads 114 or between the redistribution pad 114 and the dummy metal pattern 117, and it may thus fail to sufficiently obtain an effect in which the stress is distributed due to the protrusions P. If the width W2 of the space pattern 116 is larger than the above range, it may be difficult to efficiently design the redistribution pad 114.

The dummy metal pattern 117 may include the plurality of dummy metal patterns 117 disposed around the redistribution pads 114. In an example embodiment, the dummy metal pattern 117 may be completely separated from the redistribution pad 114 by the space pattern 116. The dummy metal pattern 117 may include the same material as the redistribution pad 114. The dummy metal pattern 117 may include a metal material including copper (Cu), aluminum (Al), silver (Ag), tin (Sn), gold (Au), nickel (Ni), lead (Pb), titanium (Ti) or an alloy thereof, for example. The dummy metal pattern 117 may be provided to secure flatness of the semiconductor package by preventing the undulation region from occurring on the first insulating layer 111a. In addition, the dummy metal pattern 117 may be disposed at an outermost side of the redistribution substrate 110 to prevent the substrate from being bent.

The dummy metal pattern 117 may have a pinwheel shape, a cross shape, or a windmill shape. For example, the dummy metal pattern 117 may include branch patterns BP extending from a center region in four directions different from one another. In example embodiments, the dummy metal pattern 117 may have branch patterns BP extending radially from the center region of the dummy metal pattern 117. An end of the branch pattern BP may have a rounded shape. The branch pattern BP may have a region having a width smaller between its end and a center of the dummy metal pattern 117. In an example embodiment, the dummy metal pattern 117 may include a first branch pattern extending in a first direction X, a second branch pattern extending in a direction opposite to the first direction X, a third pattern extending in a second direction Y, and a fourth pattern extending in a direction opposite to the second direction Y. The first direction X and the second direction Y may intersect each other. The dummy metal pattern 117 may further include an inwardly concave region CA to define the branch patterns BP. The concave region CA of the dummy metal pattern 117 may face the protrusion P of the redistribution pad 114. The end of the branch pattern BP of the dummy metal pattern 117 may face the bridge pattern 115.

The degassing opening 118 may include the plurality of degassing openings 118 passing through the redistribution pad 114 and the dummy metal pattern 117. The plurality of degassing openings 118 may each include a first hole 118a passing through the redistribution pad 114 and a second hole 118b passing through the dummy metal pattern 117. The first hole 118a may be disposed adjacent to the bridge pattern 115. One or more first holes 118a may be disposed adjacent to each of the bridge patterns 115. The first hole 118a may allow the degassed component to be easily discharged from the insulating layer 111. The first hole 118a may partially separate the redistribution pads 114 from each other to obtain a stress distribution effect. The second holes 118b may be disposed in a region including a center of each of the dummy metal patterns 117. The second hole 118b may allow the degassed component to be easily discharged from the insulating layer 111, together with the first hole 118a. In an example embodiment, a minimum distance d2 between the first hole 118a and the space pattern 116 adjacent to each other may range from about 15 μm to about 20 μm. In an example embodiment, a minimum distance d3 between the second hole 118b and the space pattern 116 adjacent to each other may range from about 15 μm to about 20 μm.

The redistribution pad 114, the bridge pattern 115, the space pattern 116, the dummy metal pattern 117, and the degassing opening 118, which are described above with reference to FIGS. 1 to 2B, may be arranged over an entire surface of the redistribution substrate 110.

The semiconductor chip 120 may be disposed on an upper surface of the redistribution substrate 110 and may include the connection pad 120p electrically connected to the redistribution layer 112. For example, the semiconductor chip 120 may be disposed in such a manner that a first surface on which the connection pad 120p is disposed faces an upper surface of the redistribution substrate 110, and the connection pad 120p may be connected to the redistribution layer 112 through the connection via 113. The connection pad 120p may include, for example, a metal material such as aluminum (Al). In an example embodiment, the semiconductor chip 120 may be mounted on the redistribution substrate 110 by flip-chip bonding.

The semiconductor chip 120 may be a logic chip or a memory chip. The logic chip may include, for example, a central processing unit (CPU), a graphics processing unit (GPU), field programmable gate array (FPGA), a digital signal processor (DSP), a cryptographic processor, a microprocessor, a microcontroller, an analog-to-digital converter or an application-specific integrated circuit (ASIC). The memory chip may include, for example, a volatile memory device such as a dynamic RAM (DRAM) or a static RAM (SRAM), or a non-volatile memory device such as a phase change RAM (PRAM), a magnetic RAM (MRAM), a resistive RAM (RRAM), or a flash memory. Alternatively, the semiconductor chip 120 may be mounted on the redistribution substrate 110 by wire bonding.

The encapsulant 130 may be disposed on the redistribution substrate 110 and may cover at least a portion of the semiconductor chip 120. The encapsulant 130 may include an insulating material, for example, a thermosetting resin such as an epoxy resin, a thermoplastic resin such as a polyimide resin, or prepreg including an inorganic filler or/and a glass fiber, ajinomoto-build up film (ABF), FR-4, bismaleimide triazine (BT) or epoxy molding compound (EMC).

The connection bump 140 may have a land, ball, or pin shape. The connection bump 140 may include, for example, tin (Sn) or an alloy including tin (Sn) (e.g., Sn—Ag—Cu). The connection bump 140 may be disposed on a lower surface of the redistribution substrate 110 opposite to the surface on which the semiconductor chip 120 is disposed, and may be electrically connected to the redistribution layer 112 and the redistribution pad 114. The connection bump 140 may physically and/or electrically connect the semiconductor package 100 to the outside. The connection bump 140 may include, for example, a solder ball.

Figure 3A:
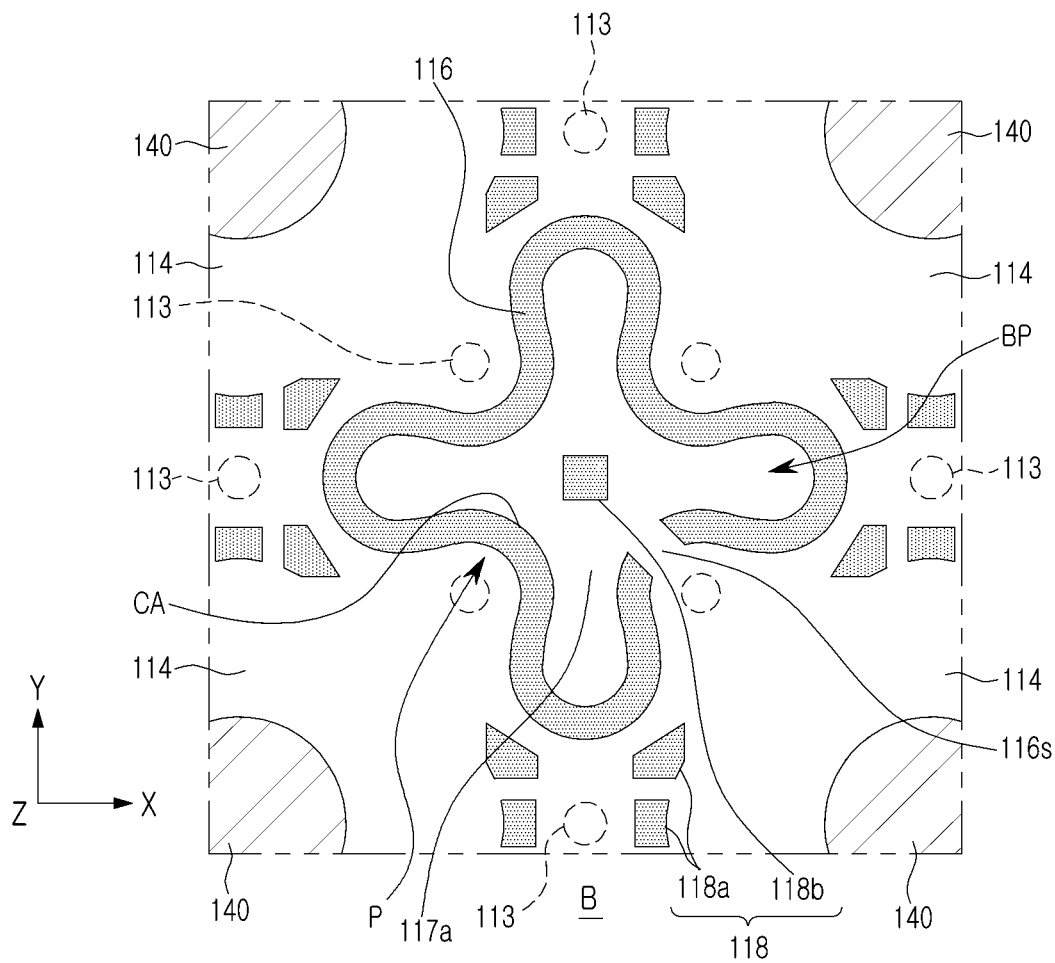
FIGS. 3A to 3C are partially enlarged plan views of the semiconductor package, according to an example embodiment.
Figure 3B:
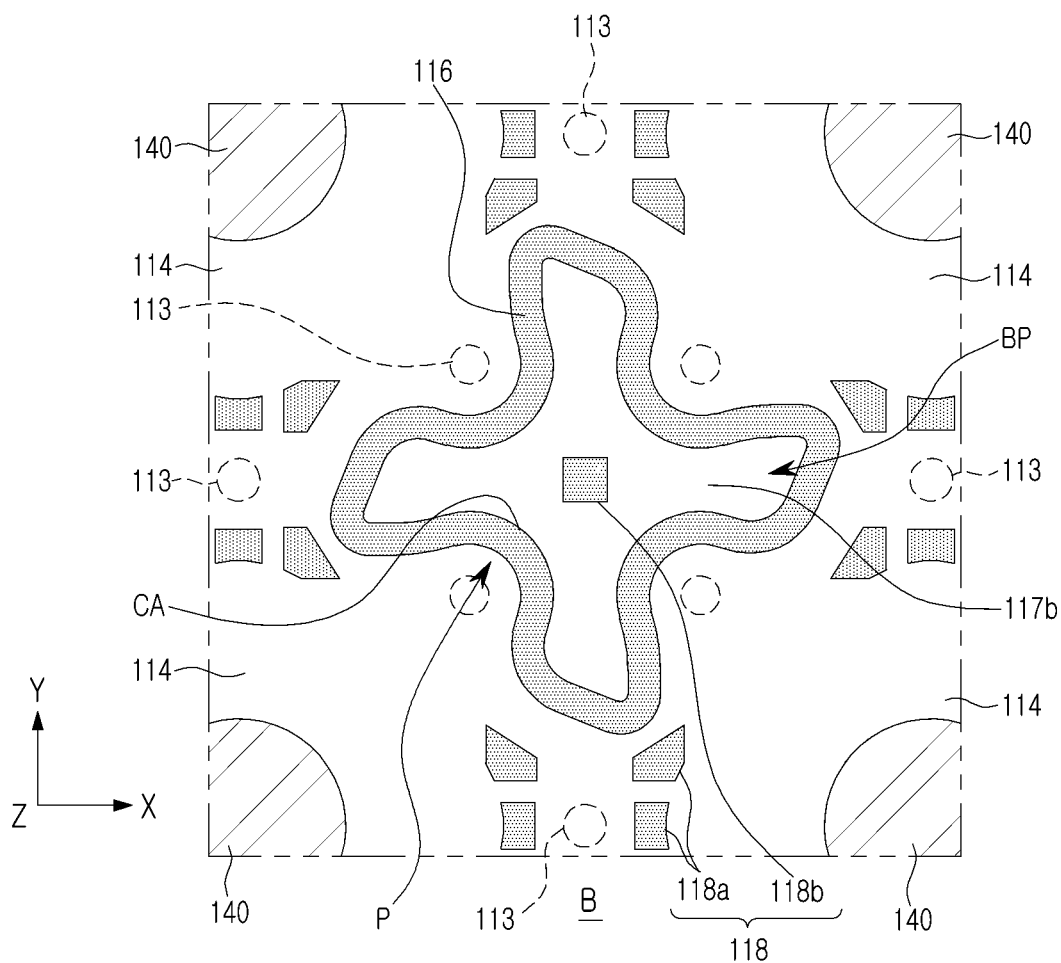
Figure 3C:
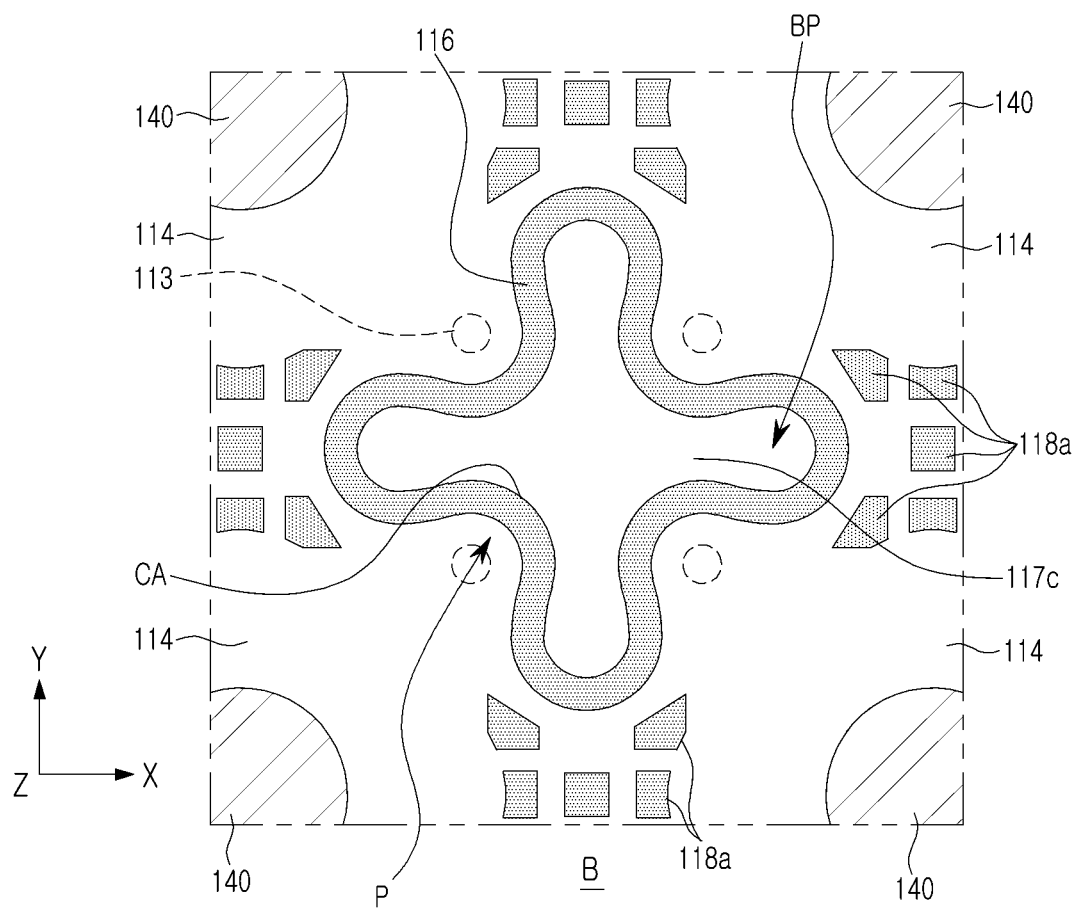

Each of FIGS. 3A to 3C is a partially enlarged plan view of the semiconductor package according to an example embodiment. Each of FIGS. 3A to 3C illustrates a region corresponding to the region of FIG. 2B.

Referring to FIG. 3A, a dummy metal pattern 117a and an adjacent redistribution pad 114 may be connected to each other through a region 116s in which the space pattern 116 is separated around the dummy metal pattern 117. For example, a first end of the space pattern 116 may be separated from a second end of the space pattern 116 by the region 116s, and the dummy metal pattern 117a may be connected to the adjacent redistribution pad 114 through the region 116s. The region 116s of the space pattern 116 may be connected to a concave region CA of the dummy metal pattern 117a. According to an embodiment, the space pattern 116 may include one or more separated regions 116s, and the dummy metal pattern 117a may thus also be connected to one or more other adjacent redistribution pads 114. The space pattern 116 may include the region 116s, and it is thus possible to prevent the undulation region from being formed on the first insulating layer 111a.

Referring to FIG. 3B, a branch pattern BP of a dummy metal pattern 117b may have an asymmetric shape to an axis parallel to a direction extending from the center thereof. For example, the branch pattern BP of the dummy metal pattern 117b may have an end portion inclined in one direction in a plane. However, the illustrated shape of the branch pattern BP of the dummy metal pattern 117b is an example, and a shape of the end portion may be variously changed according to an embodiment. In addition, a shape of the redistribution pad 114 may be variously changed.

Referring to FIG. 3C, an arrangement of the plurality of degassing openings 118 may be different from that in the previous embodiments. For example, the first hole 118a of the plurality of degassing openings 118 may be more densely disposed adjacent to the bridge pattern 115. The second hole 118b may not be disposed in a dummy metal pattern 117c. However, the illustrated arrangement of the plurality of degassing openings 118 is an example, and an arrangement of the plurality of degassing openings 118 may be variously changed according to an embodiment.

Figure 4:
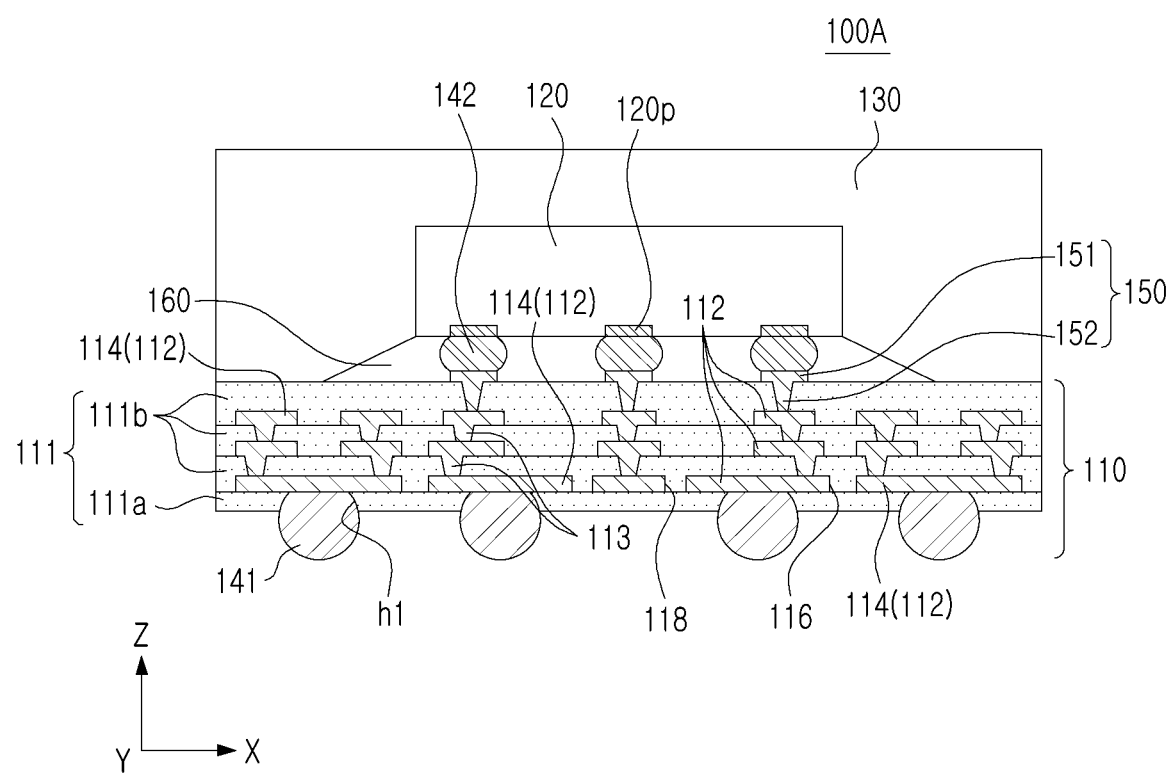
FIGS. 4 to 6 are cross-sectional views of the semiconductor package, according to an example embodiment.
Figure 5:
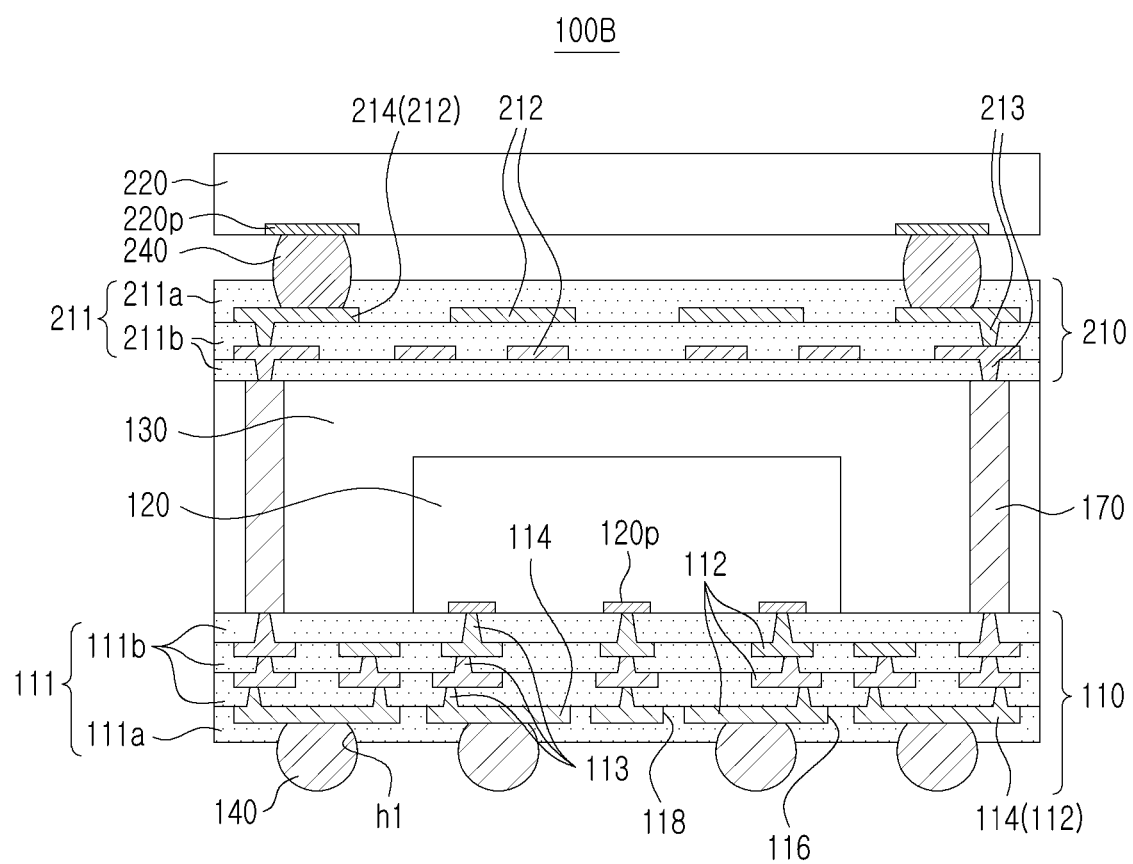
Figure 6:
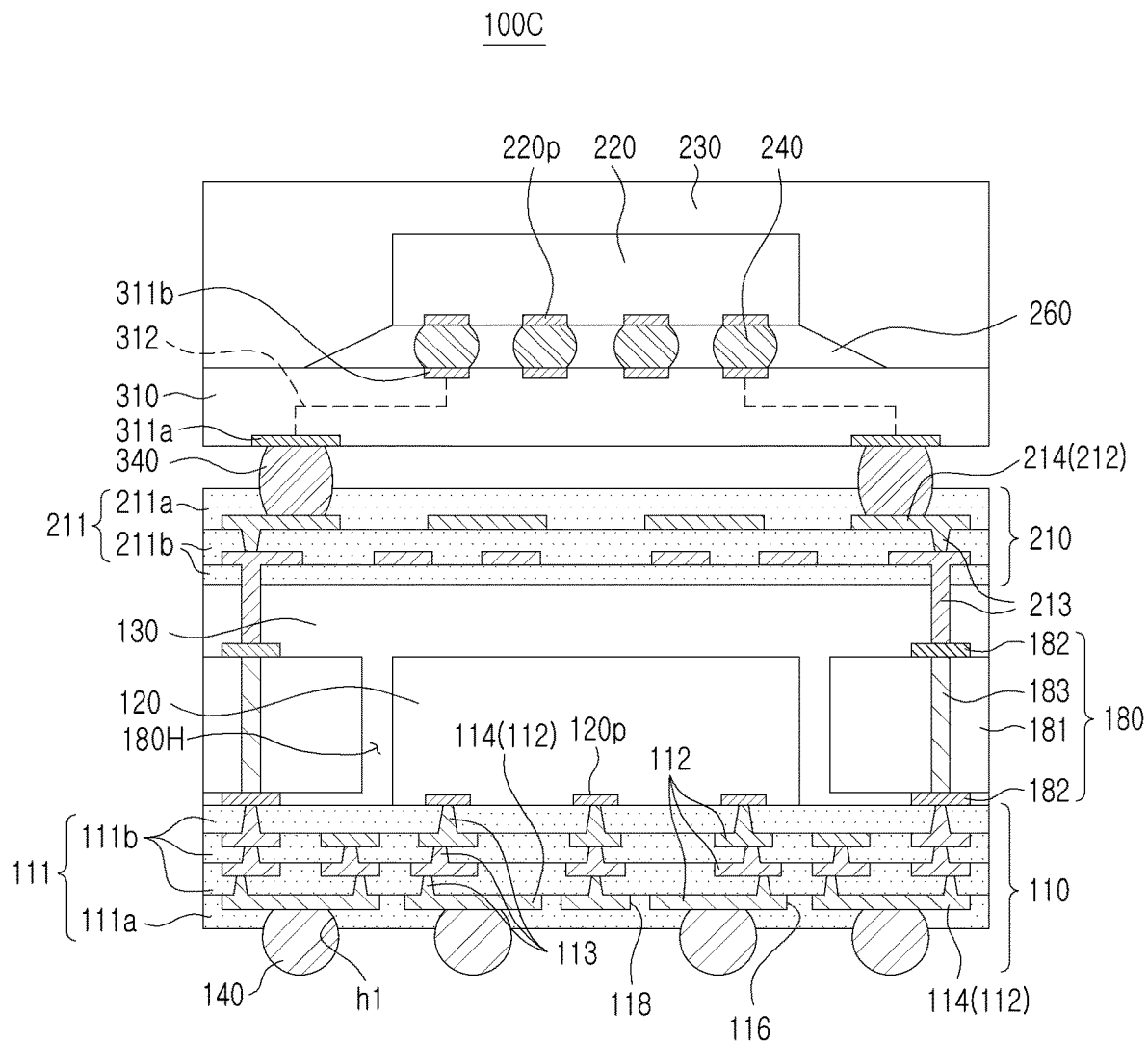

FIGS. 4 to 6 are cross-sectional views of the semiconductor package according to example embodiments.

Referring to FIG. 4, a semiconductor package 100A may include the redistribution substrate 110, the semiconductor chip 120, the encapsulant 130, and a first connection bump 141. The semiconductor package 100A may further include an under-bump metal (UBM) structure 150, a second connection bump 142, and an underfill resin 160.

The UBM structure 150 may be disposed on the upper surface of the redistribution substrate 110, and may include a UBM pad 151 and a UBM via 152. The UBM via 152 may pass through an uppermost second insulating layer 111b among the second insulating layers 111b and may electrically connect the redistribution layer 112 and the UBM pad 151 to each other. The second connection bump 142 may electrically connect the connection pad 120p of the semiconductor chip 120 and the UBM pad 151 to each other. The UBM structure 150 may include a metal material such as copper (Cu), aluminum (Al), silver (Ag), tin (Sn), gold (Au), nickel (Ni), lead (Pb), titanium (Ti) or an alloy thereof. In example embodiments, the UBM structure 150 may include a plurality of UBM structures, and the second connection bump 142 may include a plurality of second connection bumps 142. For example, each of the plurality of second connection bumps 142 may electrically connect one of the plurality of connection pads 120p with a corresponding one of the plurality of UBM pads 151.

The underfill resin 160 may fill a space between the redistribution substrate 110 and the semiconductor chip 120, and may be formed to surround the second connection bump 142. The underfill resin 160 may include an insulating resin such as an epoxy resin. The underfill resin 160 may be a portion of the encapsulant 130 formed by a molded underfill (MUF) method.

As described above with reference to FIGS. 1 to 2B, the redistribution pad 114 of the redistribution substrate 110 may be a lowermost redistribution layer 112 of the plurality of redistribution layers 112, and in the embodiment of FIG. 4, the redistribution pad 114 also may be an uppermost redistribution layer 112 of the plurality of redistribution layers 112. The redistribution pad 114 may have a planar shape as illustrated in FIGS. 1 to 2B, may prevent a crack from occurring on the first insulating layer 111a disposed at a lowermost bottom of the redistribution substrate 110, and may prevent a crack from occurring on the uppermost second insulating layer 111b disposed at an uppermost top of the redistribution substrate 110. For example, upper and lower surfaces of the redistribution pads 114 may be planar.

Referring to FIG. 5, a semiconductor package 100B may include a first redistribution substrate 110, a first semiconductor chip 120, the encapsulant 130, and a first connection bump 140. The semiconductor package 100B may further include a vertical connection structure 170, a second redistribution substrate 210, a second connection bump 240, and a second semiconductor chip 220. In example embodiments, the first connection bump 140 may include a plurality of first connection bumps 140, the vertical connection structure 170 may include a plurality of vertical connection structures 170, and the second connection bump 240 may include a plurality of second connection bumps 240.

At least a portion of a side surface of the vertical connection structure 170 may be surrounded by the encapsulant 130. The vertical connection structure 170 may be electrically connected to the redistribution layer 112. The vertical connection structure 170 may have a shape of a post in which a conductor penetrates through a portion of the encapsulant 130, or may have a shape of a multilayer substrate (e.g., PCB) in which an insulating layer and a conductive layer are sequentially stacked on each other. The vertical connection structure 170 may provide an electrical connection path passing through the first semiconductor chip 120 in the vertical direction (Z direction). A package-on-package structure may be implemented by the vertical connection structure 170.

The second redistribution substrate 210 may be disposed on the encapsulant 130 and the vertical connection structure 170, and may include an insulating layer 211, a second redistribution layer 212, a second connection via 213, and a second redistribution pad 214, in correspondence with the first redistribution substrate 110. For example, the insulating layer 211 may include the plurality of insulating layers 211 stacked on each other in the vertical direction (Z direction), and the insulating layer 211 may include a first insulating layer 211a and at least one second insulating layer 211b stacked under the first insulating layer 211a. The second redistribution layer 212 may include a plurality of second redistribution layers 212, the second connection via 213 may include a plurality of second connection vias 213, and the second redistribution pad 214 may include a plurality of second redistribution pads 214. The second redistribution pad 214 may be the uppermost second redistribution layer 212 of the second redistribution substrate 210, may have a planar shape as described above with reference to FIGS. 1 to 2B, and may have the bridge pattern, the space pattern, the dummy metal pattern and the degassing opening arranged therearound. For example, the second redistribution pads 214 may have the same configuration, shape, and distribution as the first redistribution pads 114. Due to such a configuration, shape, and distribution, it is possible to prevent a crack from occurring on the first insulating layer 211a surrounding at least a portion of the second connection bump 240. Meanwhile, it is also possible to prevent a crack from occurring on the first insulating layer 111a by the first redistribution pad 114 of the first redistribution substrate 110.

Referring to FIG. 6, a semiconductor package 100C may include the first redistribution substrate 110, the first semiconductor chip 120, the encapsulant 130, and the first connection bump 140. The semiconductor package 100C may further include a frame 180, the second redistribution substrate 210, a third redistribution substrate 310, the second semiconductor chip 220, a second encapsulant 230, the second connection bump 240, and a third connection bump 340. The first, second, and third connection bumps 140, 240, and 340 may include a plurality of first, second, and third connection bumps 140, 240, and 340, respectively.

The frame 180 may have a through hole 180H accommodating the first semiconductor chip 120. The frame 180 may include a wiring structure having an insulating layer 181, a wiring layer 182, and a wiring via 183. The numbers and arrangements of the insulating layer 181, the wiring layer 182, and the wiring via 183 included in the wiring structure are not limited to those illustrated and may be variously changed according to the embodiments.

The third redistribution substrate 310 may include redistribution pads 311a and 311b which are disposed on lower and upper surfaces thereof and may be electrically connected to the outside, respectively, and may include a redistribution circuit 312 therein, which is connected to the redistribution pads 311a and 311b. A redistribution circuit 312 may redistribute a connection pad 220p of the second semiconductor chip 220 to a fan-out region.

The second semiconductor chip 220 may include the connection pad 220p connected to an internal integrated circuit (not shown), and the connection pad 220p may be electrically connected to the third redistribution substrate 310 by the second connection bump 240. The second connection bump 240 may be surrounded by an underfill material 260. The underfill material 260 may be an insulating material including an epoxy resin or the like. The second connection bump 240 may include a solder ball or a copper pillar. In a modified example embodiment, the connection pad 220p of the second semiconductor chip 220 may be in direct contact with an upper surface of the third redistribution substrate 310, and may also be electrically connected to the redistribution circuit 312 through a via inside the third redistribution substrate 310.

The second encapsulant 230 may include a material the same as or similar to a first encapsulant 130. The third connection bump 340 may be electrically connected to the redistribution circuit 312 inside the third redistribution substrate 310 through a redistribution pad 311a disposed on a lower surface of the third redistribution substrate 310. A lower package and an upper package may be coupled to each other by the third connection bump 340. In example embodiments, each of the plurality of third connection bumps 340 may connect one of the plurality of redistribution circuits 312 with a corresponding one of the plurality of redistribution pads 311a. The third connection bump 340 may include a low melting point metal, for example tin (Sn) or an alloy including tin (Sn).

The second redistribution pad 214 may be the uppermost second redistribution layer 212 of the second redistribution substrate 210, may have the planar shape as described above with reference to FIGS. 1 to 2B, and may have the bridge pattern, the space pattern, the dummy metal pattern and the degassing opening arranged therearound. Due to such a configuration, it is possible to prevent a crack from occurring on the first insulating layer 211a surrounding at least a portion of the second connection bump 240. Meanwhile, it is also possible to prevent a crack from occurring on the first insulating layer 111a by the first redistribution pad 114 of the first redistribution substrate 110.

Figure 7:
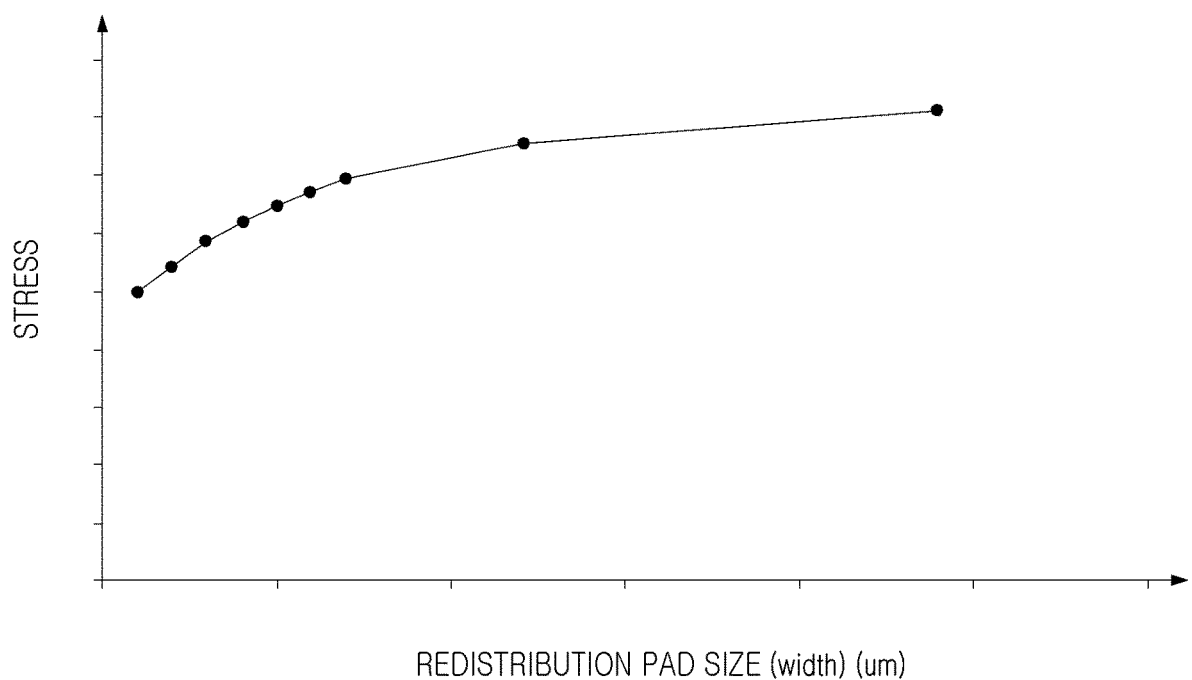
FIG. 7 is a graph illustrating a relationship between a size of the redistribution pad and stress applied to an insulating layer in the semiconductor package, according to an example embodiment.

FIG. 7 is a graph illustrating a relationship between a size of the redistribution pad and stress applied to an insulating layer in the semiconductor package according to an example embodiment.

Figure 8A:
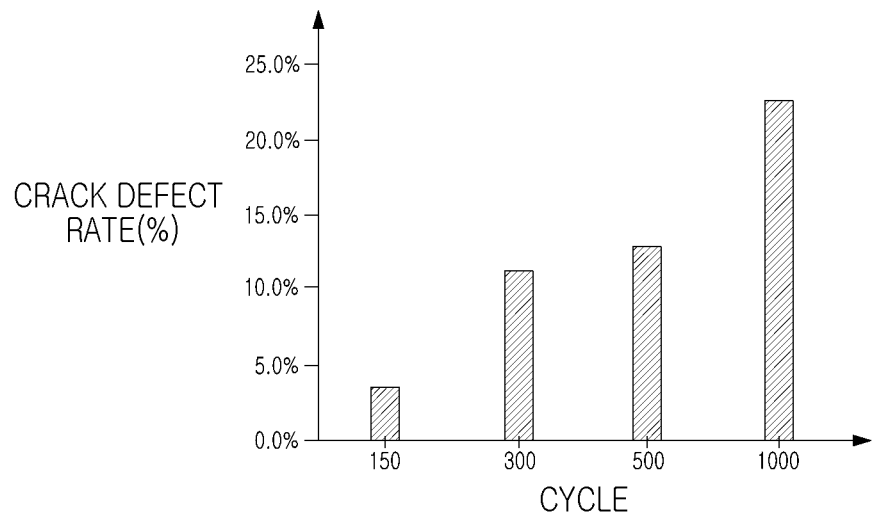
FIGS. 8A, 8B, and 8C illustrate a result of a temperature cycle test based on a design of the redistribution pad in the semiconductor package, according to an example embodiment compared with comparative examples.
Figure 8B:
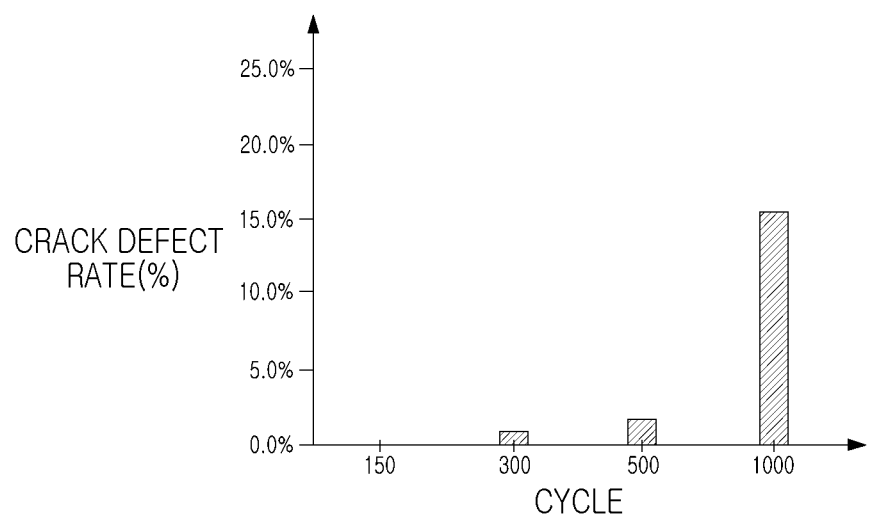
Figure 8C:
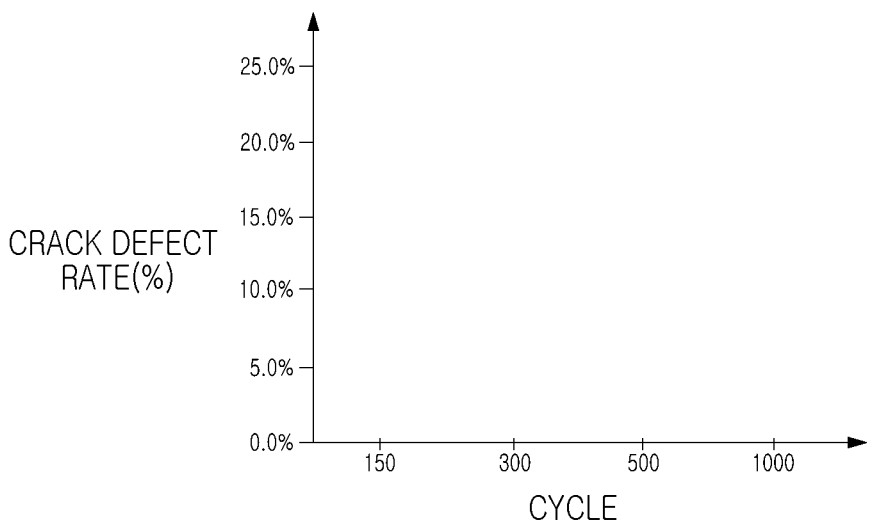

Each of FIGS. 8A, 8B and 8C illustrates a result of a temperature cycle test based on a design of the redistribution pad in the semiconductor package according to an example embodiment compared with comparative examples.

Referring to FIG. 7, the stress applied to the insulating layer may be increased as the size of the redistribution pad, e.g., a width of the redistribution pad, is increased. The redistribution pad 114 may include a metal material such as copper and may have a property of contraction/expansion by heat. An insulating layer in contact with the redistribution pad 114 and disposed at the outermost side of the redistribution substrate 110, for example, the first insulating layer 111*a* of FIG. 1, may have a coefficient of thermal expansion different from that of the redistribution pad 114, and the first insulating layer 111*a*, which has a relatively weak physical property, may be vulnerable to the stress and a crack may occur thereon. The cracking of the first insulating layer 111*a* may occur intensively in a region having a large area of the redistribution pad 114, for example, a region of the ground pattern.

FIGS. 8A, 8B and 8C each illustrate a rate of a crack occurring on the outermost insulating layer of each of Comparative Examples 1 and 2 and Inventive Example, by the temperature cycle test. Comparative Example 1 of FIG. 8A may correspond to a case where at least three redistribution pads are coupled to one another and not separated from one another; Comparative Example 2 of FIG. 8B may correspond to a case where the degassing opening is added to the redistribution pad of Comparative example 1; and Inventive Example of FIG. 8C corresponds to a case where shapes of the redistribution pad and dummy metal pattern in the embodiments of FIGS. 1 to 6 are optimized. Compared to Comparative Examples 1 and 2, Inventive example may relatively reduce a size of the redistribution pad by segmentalizing the redistribution pad, and dispose the degassing opening, thereby reducing the stress applied to the insulating layer. Accordingly, in an embodiment illustrated in FIG. 8C, no crack occurs on the insulating layer even after about 1000 temperature cycles, thereby providing a semiconductor package having improved reliability.

Each of FIGS. 9A to 9D is a cross-sectional view schematically illustrating a method of manufacturing the semiconductor package of FIG. 1.

Figure 9A:
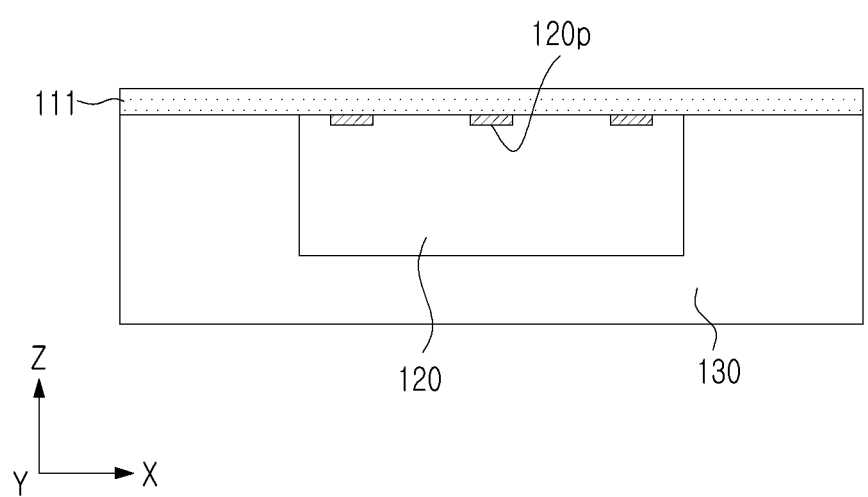
FIGS. 9A to 9D are cross-sectional views schematically illustrating an example method of manufacturing the semiconductor package of FIG. 1.

Referring to FIG. 9A, the insulating layer 111 may be formed on the surface on which the encapsulant 130 and the semiconductor chip 120 are exposed.

The insulating layer 111 may be formed to cover the connection pads 120*p* of the semiconductor chip 120. The insulating layer 111 may include a thermosetting resin such as an epoxy resin, a thermoplastic resin such as a polyimide resin, or a resin in which the thermosetting resin or the thermoplastic resin is impregnated with an inorganic filler or/and a glass fiber (or a glass cloth or a glass fabric), for example, prepreg, ajinomoto-build up film (ABF), FR-4 or bismaleimide triazine (BT). In an example embodiment, the insulating layer 111 may include a photosensitive resin such as a photoimageable dielectric (PID) resin.

Figure 9B:
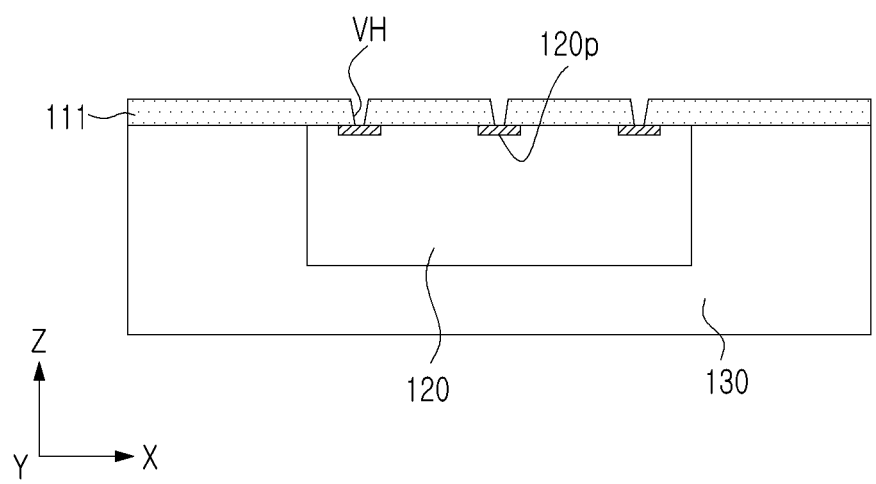

Referring to FIG. 9B, via holes VH may be formed by patterning the insulating layer 111. The via holes VH may expose surfaces of the connection pads 120*p*. The number of via holes VH may be the same as the number of connection pads 120*p*, and each via hole VH may expose a surface of a corresponding one of the connection pads 120*p*.

When the insulating layer 111 is formed of PID, which is an insulating material, the via holes VH may be formed using a photolithography process. The via holes VH may be formed using a mechanical drill, a laser drill, or the like.

Figure 9C:
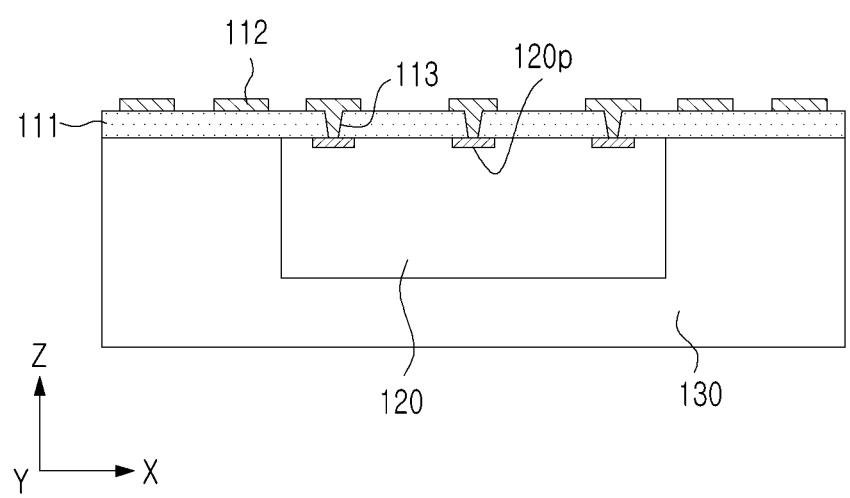

Referring to FIG. 9C, the connection vias 113 filling the via holes VH and the redistribution layers 112 connected to the connection vias 113 may be formed. For example, each of the connection vias 113 may fill a corresponding one of the via holes VH.

First, a seed layer may be formed, and the connection vias 113 filling the via holes VH and the redistribution layers 112 disposed on the insulating layer 111 may be formed by plating processes such as a semi additive process (SAP) or a modified semi additive process (MSAP).

Figure 9D:
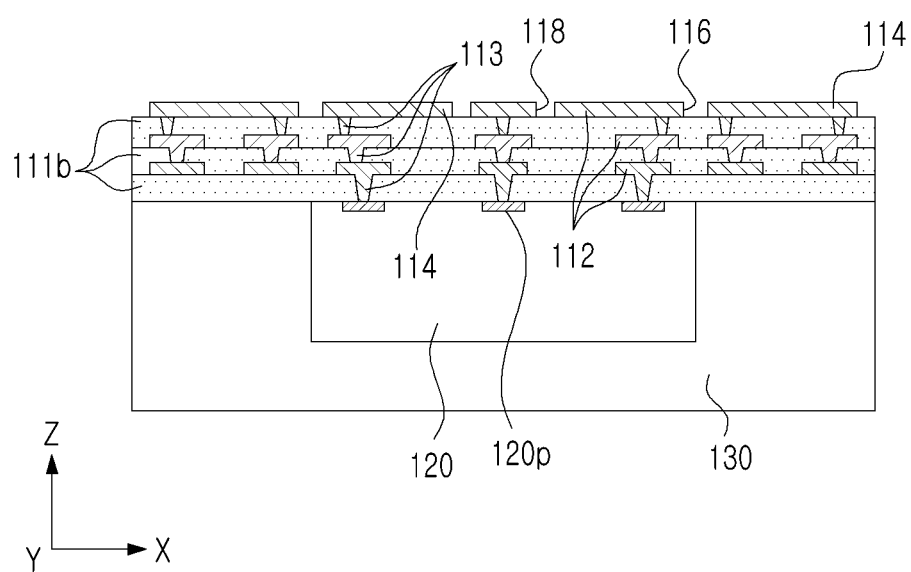

Referring to FIG. 9D, the photolithography process, the etching process and the plating process may be repeatedly performed to form the redistribution substrate 110.

The insulating layers 111 and the redistribution layers 112 may be formed by repeating the processes described with reference to FIGS. 9A to 9C. The space patterns 116 and the degassing openings 118 may be formed while forming the redistribution pads 114, the bridge patterns 115, and the dummy metal patterns 117 under the lowermost redistribution layer 112 by the plating process and the etching process. In this step, the outermost redistribution pads 114 of the redistribution substrate 110 of FIG. 1, the bridge patterns 115, and the dummy metal patterns 117 may be designed and formed to have the shapes as illustrated in FIGS. 1 to 2B.

Next, referring to FIG. 1, the first insulating layer 111*a* may be formed, the first insulating layer 111*a* may be patterned to form the openings h1, and then the connection bumps 140 may be formed to manufacture the semiconductor package 100 of FIG. 1. The openings h1 may expose a surface of each of the outermost redistribution pads 114 of the redistribution substrate 110, and each of the connection bumps 140 may contact the exposed surface of a corresponding one of the outermost redistribution pads 114.

The semiconductor package having the improved reliability may be provided by optimizing the planar shape of the redistribution pad disposed on the outermost side of the semiconductor package and the planar shape of the dummy metal pattern disposed between the redistribution pads.

Various advantages and effects of the present inventive concept are not limited to the description above, and may be more easily understood in the description of the example embodiments.

While example embodiments have been illustrated and described above, it will be apparent to those skilled in the art that modifications and variations could be made without departing from the scope of the present inventive concept as defined by the appended claims.

What is claimed is:

1. A semiconductor package comprising:
   a redistribution substrate including a connection via and a redistribution layer electrically connected to each other, and a redistribution pad electrically connected to the redistribution layer by the connection via; and
   a semiconductor chip disposed on the redistribution substrate and including a connection pad electrically connected to the redistribution layer,
   wherein the redistribution pad has a shape having a plurality of protrusions protruding in directions different to each other in a plan view, and
   wherein the redistribution substrate further includes a dummy metal pattern disposed between adjacent redistribution pads.

2. The semiconductor package of claim 1, wherein at least one of the plurality of protrusions has a corner having a rounded shape.

3. The semiconductor package of claim 1,
   wherein the redistribution pad is included in a plurality of redistribution pads, and wherein some of the plurality of redistribution pads are connected to each other by a bridge pattern.

4. The semiconductor package of claim 3, wherein the bridge pattern is a pattern in which the plurality of protrusions of the redistribution pad are connected to protrusions of an adjacent redistribution pad of the plurality of redistribution pads.

5. The semiconductor package of claim 4, wherein the bridge pattern has a width smaller toward a center thereof.

6. The semiconductor package of claim 5, wherein a minimum width of the bridge pattern is about 50 μm or more.

7. The semiconductor package of claim 3,
wherein the connection via is included in a plurality of connection vias, and
wherein at least one of the plurality of connection vias is disposed under the bridge pattern to be connected to the bridge pattern.

8. The semiconductor package of claim 3,
wherein the connection via is included in a plurality of connection vias, and
wherein some of the plurality of connection vias are arranged along the plurality of protrusions of the redistribution pad.

9. The semiconductor package of claim 1, wherein the redistribution substrate further includes a space pattern defining a boundary between the plurality of protrusions of the redistribution pad and the dummy metal pattern.

10. The semiconductor package of claim 9, wherein a portion of the dummy metal pattern is surrounded by the space pattern.

11. The semiconductor package of claim 1,
wherein the dummy metal pattern is included in a plurality of dummy metal patterns, and
wherein at least one of the plurality of dummy metal patterns has a pinwheel shape.

12. A semiconductor package comprising:
a semiconductor chip including a connection pad; and
a redistribution substrate including a redistribution pad electrically connected to the connection pad, a space pattern separating at least some of the redistribution pads from each other, a dummy metal pattern disposed on same level as the redistribution pad and at least partially surrounded by the space pattern, a redistribution layer disposed on a different level from the redistribution pad, and a connection via connecting the redistribution pad and the redistribution layer to each other,
wherein an external surface of the redistribution pad has a concave-convex shape.

13. The semiconductor package of claim 12, wherein a convex portion of the external surface of the redistribution pad has a rounded shape.

14. The semiconductor package of claim 12,
wherein the dummy metal pattern is included in a plurality of dummy metal patterns, and
wherein one of the plurality of dummy metal patterns includes branch patterns each extending in four directions different from one another.

15. The semiconductor package of claim 14, wherein an end of the branch patterns has a rounded shape.

16. The semiconductor package of claim 12, wherein a width of the space pattern separating the redistribution pad and the dummy metal pattern from each other ranges from about 30 μm to about 50 μm.

17. The semiconductor package of claim 12,
wherein the redistribution pad is included in a plurality of redistributions pads, and
wherein the redistribution substrate further includes a bridge pattern connecting at least some of the plurality of the redistribution pads to each other, a first hole passing through the redistribution pad and disposed adjacent to the bridge pattern, and a second hole passing through at least a portion of the dummy metal pattern.

18. The semiconductor package of claim 17, wherein a minimum distance between the first hole and the space pattern adjacent to each other and a minimum distance between the second hole and the space pattern adjacent to each other each ranges from about 15 μm to about 20 μm.

19. The semiconductor package of claim 12, further comprising:
an encapsulant disposed on the redistribution substrate and covering at least a portion of the semiconductor chip; and
a vertical connection structure penetrating through the encapsulant and electrically connected to the redistribution layer.

20. A semiconductor package comprising:
a redistribution substrate including a connection via and a redistribution layer electrically connected to each other, and a redistribution pad electrically connected to the redistribution layer by the connection via, a space pattern separating at least some of the redistribution pads from each other, a dummy metal pattern at least partially surrounded by the space pattern, and a degassing opening passing through at least one of the redistribution pad and the dummy metal pattern;
a connection bump electrically connected to the redistribution pad; and
a semiconductor chip disposed on the redistribution substrate and including a connection pad electrically connected to the redistribution layer,
wherein the redistribution pad includes a plurality of protrusions protruding from a same plane in directions different to each other based on a center thereof and having a corner having a rounded shape, and
wherein the dummy metal pattern includes branch patterns each extending in four directions different from one another.

* * * * *